(12) United States Patent  
Lin et al.

(10) Patent No.: US 12,419,148 B2  
(45) Date of Patent: Sep. 16, 2025

(54) DISPLAY PANEL AND METHOD OF MANUFACTURING SAME

(71) Applicant: HON HAI PRECISION INDUSTRY CO., LTD., New Taipei (TW)

(72) Inventors: Yi-Hsiang Lin, New Taipei (TW); Hui-Chu Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 512 days.

(21) Appl. No.: 17/564,569

(22) Filed: Dec. 29, 2021

(65) Prior Publication Data

US 2022/0367770 A1 Nov. 17, 2022

(30) Foreign Application Priority Data

May 12, 2021 (CN) .......................... 202110519180.4

(51) Int. Cl.  
*H10H 20/857* (2025.01)  
*H01L 21/66* (2006.01)  
(Continued)

(52) U.S. Cl.  
CPC .......... *H10H 20/857* (2025.01); *H01L 22/14* (2013.01); *H01L 22/22* (2013.01); *H01L 24/32* (2013.01); *H01L 24/83* (2013.01); *H01L 25/0753* (2013.01); *H01L 24/20* (2013.01); *H01L 2224/214* (2013.01); (Continued)

(58) Field of Classification Search  
CPC ..... H01L 22/14; H01L 24/20; H01L 25/0753; H01L 2224/83862; H01L 2924/12041; H01L 2933/0066; H01L 33/62; H01L 22/22; H01L 24/32; H01L 24/83; H01L 2224/214; H01L 2224/32238; H01L 2224/83192; H01L 2224/83385; H01L 2224/83874; H01L 33/0095; H01L 27/156; H01L 33/54; H10H 20/857; (Continued)

(56) References Cited

U.S. PATENT DOCUMENTS

| | | | | |
|---|---|---|---|---|
| 2017/0062679 A1* | 3/2017 | Lee | ........................ | G09G 1/00 |
| 2021/0091281 A1* | 3/2021 | Lv | ......................... | H01L 22/34 |
| 2022/0045123 A1* | 2/2022 | Yang | ...................... | H01L 33/38 |

FOREIGN PATENT DOCUMENTS

CN 113066801 A * 7/2021 ......... H01L 25/0753

OTHER PUBLICATIONS

Gong, Kui, CN-113066801-A, Machine Translation, (Year: 2021).*

* cited by examiner

*Primary Examiner* — Jacob Y Choi  
*Assistant Examiner* — Ashley Nicole Blackwell  
(74) *Attorney, Agent, or Firm* — ScienBiziP, P.C.

(57) ABSTRACT

A display panel of micro LEDs which provides a means of testing the installed micro LEDs for illumination qualities before final connections are made includes a transparent substrate, a plurality of electrode blocks on the transparent substrate, a plurality of conductive bonding blocks, and the micro LEDs. Each electrode block includes a slit allowing light to pass through. Each bonding block is on a surface of one electrode block away from the transparent substrate and is partially embedded in the slit of one corresponding electrode block. Each micro LED is fixed on one electrode block by a corresponding bonding block and is electrically connected with the electrode block. A method of manufacturing the display panel is further provided.

18 Claims, 6 Drawing Sheets

(51) Int. Cl.
 *H01L 23/00* (2006.01)
 *H01L 25/075* (2006.01)
 *H10H 20/01* (2025.01)
(52) U.S. Cl.
 CPC ............... *H01L 2224/32238* (2013.01); *H01L 2224/83192* (2013.01); *H01L 2224/83385* (2013.01); *H01L 2224/83862* (2013.01); *H01L 2224/83874* (2013.01); *H01L 2924/12041* (2013.01); *H10H 20/0364* (2025.01)
(58) Field of Classification Search
 CPC .. H10H 20/0364; H10H 20/01; H10H 29/142; H10H 20/853
 USPC .......................................................... 257/91
 See application file for complete search history.

DISPLAY PANEL AND METHOD OF MANUFACTURING SAME

FIELD

The subject matter herein generally relates to displays, specifically to a display panel and a method of manufacturing the display panel.

BACKGROUND

In the current display technology, micro light emitting diodes (micro LEDs) have the characteristics of high brightness and low power consumption. Micro LED display panels are self-luminous and present good color performance. At present, in the production process of micro LED display panels, non-uniform overflow of adhesive material may occur during the process of mass transfer of micro LED dies, resulting in short circuits or skewing of the micro LED dies. In the process of detection and repair, it is necessary to perform light-testing on the micro LEDs, that is, to power on the micro LEDs and detect whether the micro LEDs emit light. For vertical micro LEDs, the light-testing needs to be performed after an upper electrode block is formed. If an abnormality is detected, the upper electrode block needs to be removed for the repair process, which is expensive and difficult to repair.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
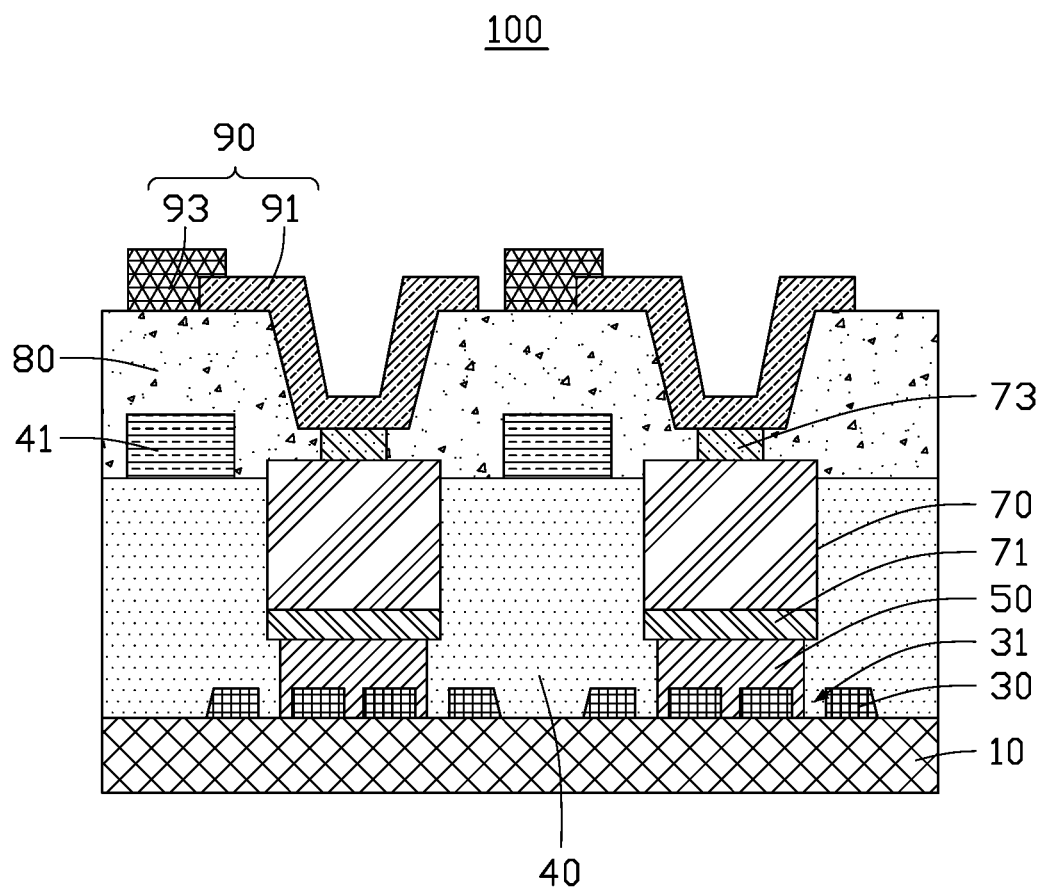
FIG. 1 is a cross-sectional view of a display panel according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

The term "micro LED" or "micro light emitting diode" in the present disclosure refers to an inorganic light emitting diode with a size of less than 200 um, specifically less than 50 μm.

A display panel in one embodiment is disclosed. As shown in FIG. 1, display panel 100 includes a transparent substrate 10, a plurality of electrode blocks 30, a plurality of conductive bonding blocks 50, a plurality of micro LEDs 70, an insulating layer 40, a black matrix 41, a planarization layer 80, and an electrode layer 90. The electrode blocks 30 are on the transparent substrate 10. Each electrode block 30 includes a slit 31 configured for transmitting light. Each slit 31 extends through the electrode block 30 to which it belongs. Each bonding block 50 is on a side of one electrode block 30 away from the transparent substrate 10, and each bonding block 50 is partially embedded in the slit 31 of one electrode block 30. Each micro LED 70 is on a side of one bonding block 50 away from the electrode blocks 30. That is, each micro LED 70 is bound to one electrode block 30 by a bonding block 50. Each electrode block 30 and the one bonding block 50 are electrically bonded. The insulating layer 40 is on a side of the transparent substrate 10 carrying the electrode blocks 30, and the electrode blocks 30, the bonding blocks 50, and the micro LEDs 70 are embedded in the insulating layer 40. The black matrix 41 is on a side of the insulating layer 40 away from the transparent substrate 10. The planarization layer 80 covers the insulating layer 40 and the black matrix 41. The electrode layer 90 extends through the planarization layer 80 and is electrically connected to each micro LED 70.

In one embodiment, the display panel 100 further includes a driving module (not shown). The driving module may be an integrated circuit, a driving chip, or a combination of multiple chips. The driving module is electrically connected to each electrode block 30, for example, by metal wires, so as to transmit an electrical signal (e.g., a voltage signal) to each micro LED 70 bound to the electrode block 30. The electrode layer 90 is a common cathode and delivers a common voltage signal to the plurality of micro LEDs 70. The voltage signal delivered by the driving module is different from the voltage signal delivered by the electrode layer 90, forming a voltage difference between the two electrodes of the micro LED 70 and so driving the micro LED 70 to emit light. Whether each micro LED 70 emits light or does not, and the brightness of any light emitted, can be controlled by the driving module.

Figure 2:
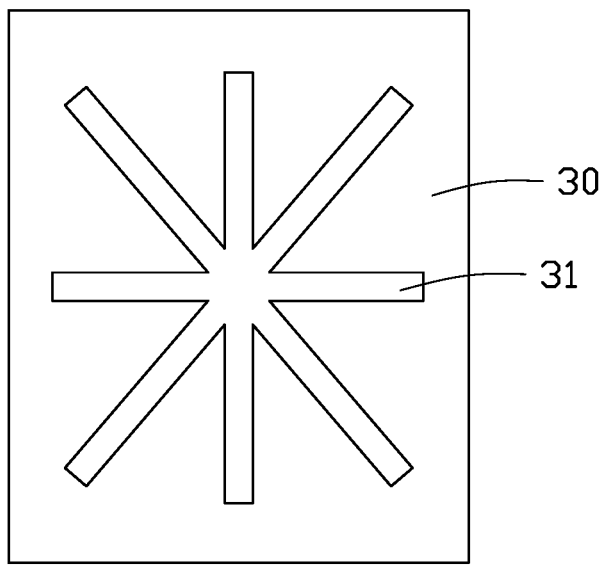
FIG. 2 is a top view of an electrode block of the display panel according to an embodiment of the present disclosure.
Figure 3:
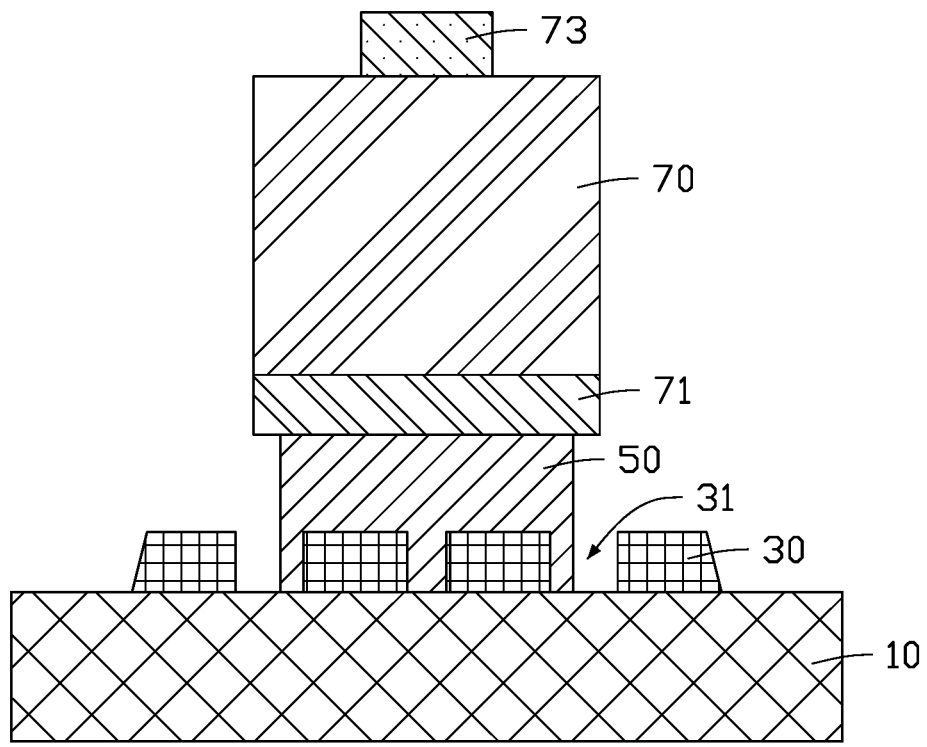
FIG. 3 is a cross-sectional view of one electrode block and one micro LED after bonding in the panel according to an embodiment of the present disclosure.

As shown in FIGS. 2 and 3, the slit 31 of one electrode block 30 has shape of an asterisk or shining star. The slit 31 includes four strips intersecting at the geometric center of the electrode block 30, and an angle between any two adjacent strips can be 45°. The bonding block 50 is in the center of the slit 31, the micro LED 70 is on the bonding block 50 and partially covers the slit 31, and the slit 31 is partially embedded in the bonding block 50. A height difference is formed between the slit 31 and the electrode block 30, so that the slit can accommodate a part of the bonding block 50. Additionally, the micro LED 70 partially covers the slit 31, so that a part of the bonding block 50 extends into a portion of the slit 31 which is not covered by the micro LED 70, avoiding adhesive overflow of the bonding block 50 and a short circuit caused by the overflow. Since the bonding block 50 is partially embedded in the slit 31, a contact area between the bonding block 50 and the electrode block 30 is increased, thereby increasing adhesion between the bonding block 50 and the electrode block 30, this effectively improves adhesion between the micro LED 70 and the electrode block 30. Additionally, due to the increase in the contact area, a resistance value of the bonding block 50 is reduced, and ohmic contact between the micro LED 70 and the electrode block 30 is improved.

Figure 4A:
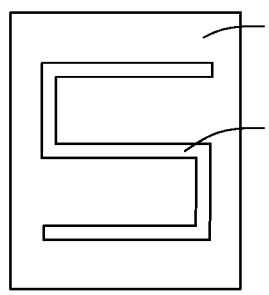
FIG. 4A through FIG. 4G are top views of an electrode block in other embodiments.
Figure 4B:
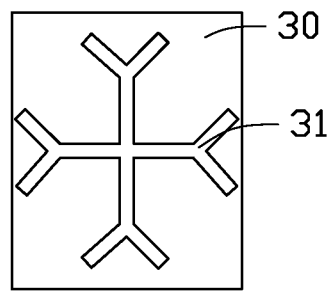
Figure 4C:
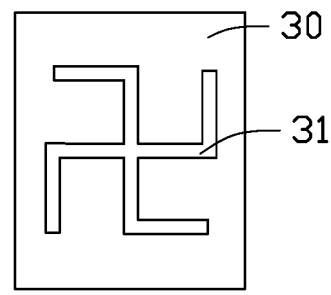
Figure 4D:
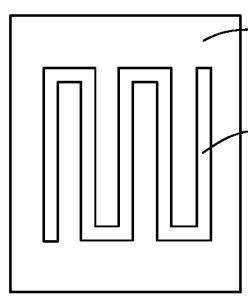
Figure 4E:
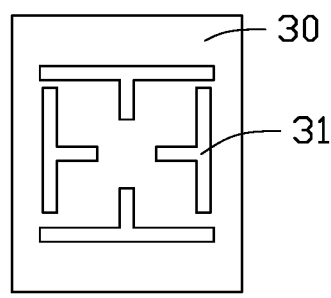
Figure 4F:
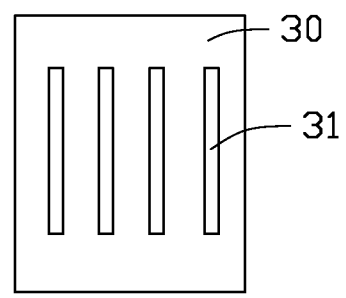
Figure 4G:
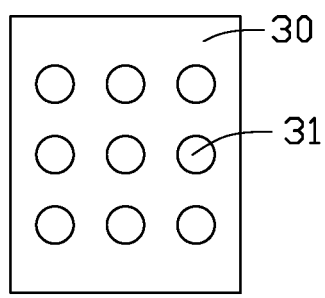

As shown in FIG. 4A through FIG. 4G, the slit 31 of each electrode block 30 can be a pattern covering micro LED 70, such as an "S" shape (FIG. 4A), a snowflake shape (FIG. 4B), a swastika shape (FIG. 4C), a snake shape (FIG. 4D), a cloister shape (FIG. 4E), a row-of-stripes shape (FIG. 4F), or a mesh shape (FIG. 4G). That is, the pattern has a part that is not covered by the micro LED 70, to accommodate the excess part of the bonding block 50 if and when the bonding block 50 has an adhesive overflow.

Referring again to FIG. 1, the micro LED 70 is a vertical micro LED. That is, the micro LED 70 includes a lower electrode 71 close to the electrode block 30 and an upper electrode 73 away from the electrode block 30. The lower electrode 71 and the upper electrode 73 are respectively at upper and lower ends of the micro LED 70 opposite to each other. In other embodiments, the micro LED 70 can be a horizontal micro LED, that is, the two electrodes of the micro LED 70 are at a same end of the micro LED 70.

In one embodiment, a material of the transparent substrate 10 may be glass or other transparent material.

In one embodiment, the electrode block 30 is made of an opaque conductive material such as metal. In other embodiments, the electrode block 30 can be made of other conductive material such as transparent conductive oxide.

In one embodiment, the bonding block 50 is conductive light-curing die-bonding paste. In other embodiments, the bonding block 50 can be silver glue, thermally-curing die-bonding paste, or flux.

In one embodiment, a material of the insulating layer 40 is a dielectric material, and the black matrix 41 surrounds each micro LED 70 keeps separate the light emitted by each micro LED 70, to prevent light mixing. The planarization layer 80 is made of an organic material, for adjusting a height difference caused by different functional layers on the display panel 100, to prevent cross-interference of electric fields, and to reduce power consumption.

In one embodiment, the electrode layer 90 includes a connecting portion 91 for electrical connection with the upper electrode 73 of each micro LED 70, and an electrode portion 93 on the planarization layer 80. The electrode portion 93 and the black matrix 41 at least partially overlap. Along a thickness direction of the display panel 100, a projection of the electrode portion 93 on the transparent substrate 10 falls within a projection of the black matrix 41 on the transparent substrate 10. That is, a size of the projection of the electrode portion 93 is less than or equal to a size of the projection of the black matrix 41. In one embodiment, the electrode portion 93 is arranged in alignment with the black matrix 41. A material of the connecting portion 91 is transparent, such as indium tin oxide, and a material of the electrode portion 93 may be opaque, such as a metal conductive material that does not pass light. In other embodiments, the material of the connecting portion 91 may be other transparent conductive materials.

Figure 5:
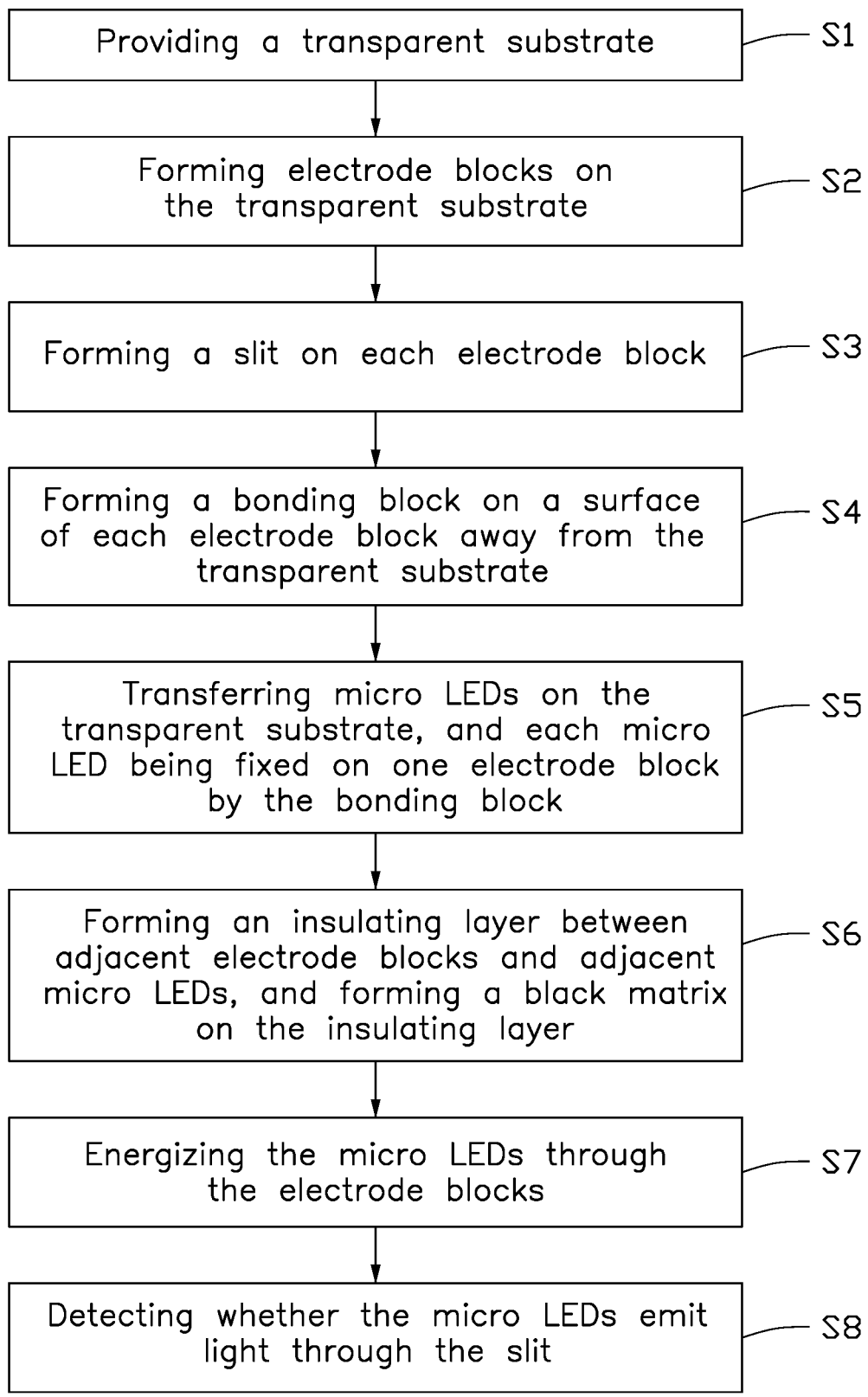
FIG. 5 is a flow chart of a method of manufacturing a display panel according to an embodiment of the present disclosure.

FIG. 5 shows a flowchart of a method of manufacturing a display panel according to an embodiment of the present disclosure. The example method is provided by way of example, as there are a variety of ways to carry out the method. Each block shown in FIG. 5 represents one or more processes, methods, or subroutines carried out in the example method. Furthermore, the illustrated order of blocks is by example only, and the order of the blocks can be changed. Additional blocks can be added, or fewer blocks can be utilized, without departing from this disclosure. The example method can begin at block S1.

In block S1, a transparent substrate is provided.

In block S2, a plurality of electrode blocks is formed on the transparent substrate.

In block S3, a slit is formed on each electrode block.

In block S4, a bonding block is formed on a surface of each electrode block away from the transparent substrate.

In block S5, a plurality of micro LEDs is transferred onto the transparent substrate, so that each micro LED is fixed on one electrode block by the bonding block.

In block S6, an insulating layer is formed between adjacent electrode blocks and adjacent micro LEDs, and a black matrix is formed on the insulating layer.

In block S7, the micro LEDs can be energized by the electrode blocks for testing and use.

In block S8, whether the micro LEDs emit light is detectable through the slit.

In one embodiment, in block S2, a driving module is provided, and each electrode block is electrically connected to the driving module.

In one embodiment, in block S3, the slit may be formed by photolithography, laser etching, or other methods.

In one embodiment, in block S4, the adhesive is dispensed, and the adhesive partially covers the slit 31. In step S5, each micro LED 70 is transferred to the adhesive on one corresponding electrode block 30. Due to the gravity, the micro LED 70 presses a portion of the adhesive into the slit 31. In one embodiment, a certain pressure can be applied to the micro LED 70 when the micro LED 70 is transferred to the electrode block 30, so that the adhesive is pressured to enter the slit 31, thereby preventing skewing of the micro LED 70 after incomplete bonding due to uneven diffusion of the adhesive.

In one embodiment, a material of the adhesive in step S4 is ultraviolet-curing die bonding paste. In step S5, ultraviolet light is emitted from a side of the transparent substrate 10 away from the electrode blocks 30, the ultraviolet light passes through the slit 31 and irradiates the adhesive, so that the adhesive is cured to form the bonding blocks 50, and the binding process is completed. In other embodiments, the adhesive can be silver glue or solid crystal glue, and the adhesive can be cured by a thermally-curing method to form the bonding blocks 50, to complete the binding.

In one embodiment, in step S5, a projection of each micro LED 70 on the transparent substrate 10 partially covers the slit 31. That is, the portion of the slit 31 not covered by the micro LED 70 can allow light to pass. A detection of light of the micro LEDs 70 can be performed through the slit 31, that is, step S7 and step S8 are performed.

Figure 6:
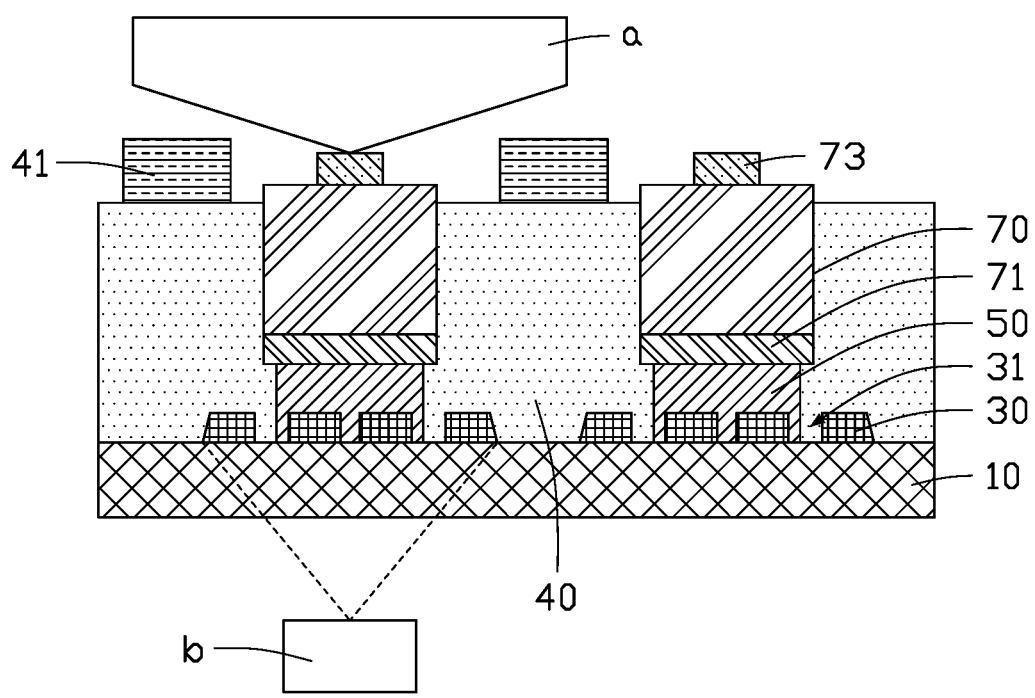
FIG. 6 is a schematic view of a display panel tested according to an embodiment of the present disclosure.

Referring to FIG. 6, block S7 further includes using a probe a to energize the upper electrode 73 of each micro LED 70. That is, a test voltage is applied to the upper electrode 73 of each micro LED 70 by the probe a, so that a voltage difference is formed between the upper electrode 73 and the lower electrode 71 of the micro LED 70, and the micro LED 70 is driven to emit light. In Step S8, an optical inspection machine b is arranged on the side of the transparent substrate 10 away from the micro LEDs 70 and is directed toward the micro LED 70 electrically connected to the probe a. When the micro LED 70 is energized, the optical inspection machine b detects light or no light from the micro LED 70 through the portion of the slit 31 that transmits light, so as to detect the quality of the micro LED 70. Since the size of each micro LED 70 is very small, about 1 μm to 50 μm, and needle section of the probe is much larger than a micro LED 70, light emission is difficult to detect from the micro LED 70 when testing is done from a side of the upper electrode 73 of the micro LED 70 when the power is applied. Since the light emitted by the micro LEDs 70 can pass through the slit 31, the light emitting qualities of the micro LEDs 70 can be detected from the other side of the display panel 100. In one embodiment, the probe energizes the upper electrode 73 of the micro LED 70, and the micro LED 70 can be lighted up and detected before the electrode layer 90 is formed. Thus, there will be no need to disassemble any part of the electrode layer 90 when some micro LEDs 70 need replacement or repair, which is beneficial to save costs, reduces the disassembly and assembly process, and reduces the technical difficulty. In other embodiments, the optical inspection machine b can be arranged on a side of the transparent substrate 10 close to the micro LEDs 70 to receive light emitted by the micro LEDs 70 that is not blocked by the probe a. That is, the optical inspection machine b can be located at any position on the same side as the probe a and so can receive the light emitted by the micro LEDs 70. Thus, the light testing of the micro LEDs 70 can be performed before the electrode layer 90 is formed.

In other embodiments, the material of the electrode block 30 may be a transparent conductive material, and the light-testing process can be done through the slit 31 or directly through the electrode block 30. The micro LED 70 can be a horizontal micro LED. In step S7, it is not necessary to use the probe a to energize each micro LED 70. In step S8, it is not necessary to pass through the slit 31 to detect whether the micro LED 70 emits light or not. That is, the optical inspection machine b can perform light-testing on the side of the transparent substrate 10 close to the micro LEDs 70.

In one embodiment, specifically, the light-testing is done by using the probe a and the optical inspection machine b to energize each micro LED 70 and test whether the micro LED 70 emits light. In other embodiments, every three micro LEDs 70 form a group, and each group includes micro LEDs 70 emitting light of red, green, and blue. Each group of micro LEDs 70 can be energized at one time, and light-emitting qualities of each group of micro LEDs 70 are directly detected. The method further includes sampling inspections, such as checking the light emission of one micro LED 70 every three micro LEDs 70, so as to obtain the overall yield rate.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A display panel, comprising:
   a transparent substrate;
   a plurality of electrode blocks on the transparent substrate, wherein each of the plurality of electrode blocks comprises a closed-shaped slit;
   a plurality of conductive bonding blocks, wherein each of the plurality of conductive bonding blocks is on a surface of a corresponding one of the plurality of electrode blocks away from the transparent substrate and each of the plurality of conductive bonding blocks is partially embedded in the slit of the corresponding one of the plurality of electrode blocks; and
   a plurality of micro light emitting diodes (micro LEDs), wherein each of the plurality of micro LEDs is fixed on and electrically connected to a corresponding one of the plurality of electrode blocks by the corresponding one of the plurality of conductive bonding blocks, along a thickness direction of the display panel, a projection of each of the plurality of micro LEDs on the transparent substrate partially covers the slit of the corresponding one of the plurality of electrode blocks, and a portion of the slit not covered by the plurality of micro LEDs is configured for transmitting light, such that light emitted by the micro LEDs transmits through a portion of the slit not covered by the plurality of micro LEDs to a side of the transparent substrate away from the plurality of micro LEDs.

2. The display panel of claim 1, wherein a material of the plurality of electrode blocks is an opaque conductive material or a transparent conductive material.

3. The display panel of claim 1, wherein each of the plurality of micro LEDs is a horizontal type micro LED or a vertical type micro LED.

4. The display panel of claim 1, wherein a material of the plurality of conductive bonding blocks is light-curing die-bonding paste, thermally-curing die-bonding paste, silver glue, or flux.

5. The display panel of claim 1, wherein the slit has an asterisk shape, an "S" shape, a snowflake shape, a swastika shape, a snake shape, a cloister shape, a stripe shape, or a mesh shape.

6. The display panel of claim 1, further comprising an insulating layer on the transparent substrate, wherein the plurality of conductive electrode blocks, the plurality of conductive bonding blocks, and the plurality of micro LEDs are embedded in the insulating layer.

7. The display panel of claim 6, further comprising a black matrix, wherein the black matrix is on a side of the insulating layer away from the transparent substrate, and the black matrix surrounds each of the plurality of micro LEDs.

8. The display panel of claim 7, further comprising a planarization layer covering the insulating layer and the black matrix, and an electrode layer extending through the planarization layer and electrically connected to each of the plurality of micro LEDs.

9. The display panel of claim 8, wherein the electrode layer comprises a connecting portion extending through the planarization layer and electrically connected to each of the plurality of micro LEDs; and an electrode portion electrically connected to the connecting portion, wherein a material of the connecting portion is transparent, and a material of the electrode portion is opaque.

10. The display panel of claim 9, wherein along a thickness direction of the display panel, a projection of the electrode portion on the transparent substrate falls within a projection of the black matrix on the transparent substrate.

11. A method of manufacturing a display panel, comprising:
   providing a transparent substrate;
   forming a plurality of electrode blocks on the transparent substrate;
   forming a closed-shaped slit on each of the plurality of electrode blocks;
   forming a conductive adhesive on a surface of the plurality of electrode blocks away from the transparent substrate; and
   transferring a plurality of micro LEDs on the transparent substrate, wherein each of the plurality of micro LEDs is fixed on and is electrically connected to a corresponding one of the plurality of electrode blocks by the conductive adhesive, the conductive adhesive is partially embedded in the slit of the corresponding one of the plurality of electrode blocks, and along a thickness direction of the transparent substrate, a projection of each of the plurality of micro LEDs on the transparent substrate partially covers the slit of the corresponding one of the plurality of electrode blocks, and a portion of the slit not covered by the plurality of micro LEDs is configured for transmitting light, such that light emitted by the micro LEDs transmits through a portion of the slit not covered by the plurality of micro LEDs to a side of the transparent substrate away from the plurality of micro LEDs.

12. The method of manufacturing the display panel of claim 11, after transferring the plurality of micro LEDs on the transparent substrate, the method further comprising energizing the plurality of micro LEDs by the plurality of electrode blocks and detecting whether the plurality of micro LEDs emit light through the slit.

13. The method of manufacturing a display panel of claim 12, wherein each of the plurality of micro LEDs comprises a lower electrode on a side close to the transparent substrate and an upper electrode on a side away from the transparent substrate.

14. The method of manufacturing a display panel of claim 13, wherein energizing the plurality of micro LEDs comprises energizing the upper electrode of each of the plurality of micro LEDs by a probe.

15. The method of manufacturing a display panel of claim 14, wherein detecting whether the plurality of micro LEDs emit light through the slit is carried out by an optical inspection machine on a side of the transparent substrate away from the plurality of micro LEDs.

16. The method of manufacturing a display panel of claim 11, wherein a material of the conductive adhesive is an ultraviolet curing die bonding paste, and transferring the plurality of micro LEDs on the transparent substrate comprises irradiating ultraviolet light through the slit to cure the conductive adhesive.

17. The method of manufacturing a display panel of claim 11, wherein a material of the conductive adhesive is a thermally-curing die-bonding paste or silver glue, and transferring the plurality of micro LEDs on the transparent substrate comprises thermal curing of the conductive adhesive.

18. The method of manufacturing a display panel of claim 11, wherein the slit is formed by photolithography or laser etching.

* * * * *